(12) United States Patent
Lee

(10) Patent No.: US 9,999,148 B2
(45) Date of Patent: Jun. 12, 2018

(54) ELECTRONICS HOUSING AND MANUFACTURING METHOD OF ELECTRONICS HOUSING

(71) Applicant: Cheng Uei Precision Industry Co., Ltd., New Taipei (TW)

(72) Inventor: James Lee, New Taipei (TW)

(73) Assignee: Cheng Uei Precision Industry Co., Ltd., New Taipei (TW)

( * ) Notice: Subject to any disclaimer, the term of this patent is extended or adjusted under 35 U.S.C. 154(b) by 0 days. days.

(21) Appl. No.: 15/620,828

(22) Filed: Jun. 13, 2017

(65) Prior Publication Data

US 2017/0280576 A1  Sep. 28, 2017

Related U.S. Application Data

(62) Division of application No. 14/864,739, filed on Sep. 24, 2015, now Pat. No. 9,844,160.

(51) Int. Cl.
| | |
|---|---|
| *H05K 5/06* | (2006.01) |
| *H01B 3/44* | (2006.01) |
| *H05K 5/00* | (2006.01) |
| *H05K 5/02* | (2006.01) |
| *H01B 1/02* | (2006.01) |

(52) U.S. Cl.
CPC ............... *H05K 5/066* (2013.01); *H01B 1/02* (2013.01); *H01B 3/441* (2013.01); *H01B 3/442* (2013.01); *H05K 5/0086* (2013.01); *H05K 5/0243* (2013.01)

(58) Field of Classification Search
CPC .......... Y10T 29/4998; Y10T 29/49982; H05K 5/066; H05K 5/0243; H05K 5/0086; H01B 1/02; H01B 3/442; H01B 3/441
See application file for complete search history.

(56) References Cited

U.S. PATENT DOCUMENTS

| 4,247,600 | A | * | 1/1981 | Adachi | ..................... C08J 7/045 396/458 |
|---|---|---|---|---|---|
| 4,931,366 | A | * | 6/1990 | Mullaney, Jr. | ......... B05D 5/068 33/769 |
| 5,676,812 | A | * | 10/1997 | Kadokura | ............... C25D 13/12 174/350 |
| 6,869,644 | B2 | * | 3/2005 | Buhay | ................ B32B 17/10036 427/376.2 |
| 6,996,425 | B2 | * | 2/2006 | Watanabe | ........... H04M 1/0214 379/433.01 |

(Continued)

*Primary Examiner* — Jason L Vaughan
(74) *Attorney, Agent, or Firm* — Lin & Associates Intellectual Property, Inc.

(57) ABSTRACT

An electronics housing includes a base body and a metal plating layer formed on a surface of the base body. The base body includes an upper cover, a lower cover and a metal ring. The upper cover and the lower cover are integrally fused by virtue of an ultra high frequency technology, and the metal ring is embedded between the upper cover and the lower cover. A nickel-deposited layer of the metal plating layer is electrolessly deposited on the surface of the base body. A copper layer of the metal plating layer is plated on the nickel-deposited layer. A nano-nickel layer of the metal plating layer is plated on the copper layer. A surface decoration layer of the metal plating layer is plated on the nano-nickel layer. The base body together with the metal plating layer defines at least one assembling hole.

9 Claims, 6 Drawing Sheets

(56) References Cited

U.S. PATENT DOCUMENTS

| | | | | |
|---|---|---|---|---|
| 7,232,615 B2* | 6/2007 | Buhay | .............. | B32B 17/10036 |
| | | | | 428/212 |
| 7,311,961 B2* | 12/2007 | Finley | ..................... | B32B 17/00 |
| | | | | 428/212 |
| 7,688,574 B2* | 3/2010 | Zadesky | ............. | H04M 1/0252 |
| | | | | 361/679.21 |
| 7,862,910 B2* | 1/2011 | Krisko | ................... | B01J 35/004 |
| | | | | 428/432 |
| 7,947,900 B2* | 5/2011 | Cheng | .................... | B32B 15/01 |
| | | | | 174/50 |
| 8,097,344 B2* | 1/2012 | Chiang | .................... | C09D 7/67 |
| | | | | 428/469 |
| 8,398,841 B2* | 3/2013 | Khosla | ..................... | C25D 5/02 |
| | | | | 205/118 |
| 8,406,832 B2* | 3/2013 | Ye | .......................... | A63F 13/08 |
| | | | | 428/45 |
| 8,450,607 B2* | 5/2013 | Du | ......................... | B32B 37/24 |
| | | | | 174/50 |
| 8,470,419 B2* | 6/2013 | Chiang | .............. | C03C 17/2456 |
| | | | | 428/34.4 |
| 8,733,422 B2* | 5/2014 | Browning | ................ | H05K 5/04 |
| | | | | 164/100 |
| 9,034,166 B2* | 5/2015 | Tatebe | .................... | C25D 5/00 |
| | | | | 205/205 |
| 9,280,183 B2* | 3/2016 | Tatebe | .................. | G06F 1/1656 |
| 9,930,798 B2* | 3/2018 | Browning | ................ | H05K 5/04 |
| 2013/0292396 A1* | 11/2013 | Dinh | ..................... | B29C 63/34 |
| | | | | 220/651 |

* cited by examiner

ELECTRONICS HOUSING AND MANUFACTURING METHOD OF ELECTRONICS HOUSING

CROSS-REFERENCES TO RELATED APPLICATIONS

This is a division of U.S. patent application Ser. No. 14/864,739, filed Sep. 24, 2015, which is incorporated herewith by reference in its entirety.

BACKGROUND OF THE INVENTION

1. Field of the Invention

The present invention generally relates to a housing, and more particularly to an electronics housing and a manufacturing method of electronics housing.

2. The Related Art

Currently, with the development of electronic technologies, a variety of electronicses are constantly updated. In general, the electronicses are handheld products, wearable products, etc. Accordingly, accessories applied to the electronicses are also constantly improved for catering development requirements of the electronicses. As is known to all, an electronics housing is one of the most important accessories of the electronicses. A current electronics housing includes a base body and a holder. A material of the base body is plastic. The base body is plated to make a metal plating layer formed on a surface of the base body. The plated base body and the holder are adhered with each other by an adhering technology.

However, the plated base body and the holder are adhered with each other to form the electronics housing by virtue of the adhering technology that lowers a waterproof performance, and simultaneously, the material of the base body is plastic, the metal plating layer is hardly formed on the surface of the base body, so a surface of the electronics housing has a worse abrasion performance and a worse corrosion resistance performance. As a result, an appearance glossiness of the electronics housing is affected.

SUMMARY OF THE INVENTION

An object of the present invention is to provide an electronics housing and a manufacturing method of electronics housing. The electronics housing includes a base body and a metal plating layer. The base body includes an upper cover, a lower cover and a metal ring. The upper cover and the lower cover are integrally fused by virtue of an ultra high frequency technology, and the metal ring is embedded between the upper cover and the lower cover. The metal plating layer is formed on a surface of the base body. The metal plating layer includes a nickel-deposited layer formed on the surface of the base body, a copper layer formed on a surface of the nickel-deposited layer, a nano-nickel layer formed on a surface of the copper layer, and a surface decoration layer formed on a surface of the nano-nickel layer.

The manufacturing method of electronics housing adapted for being applied in manufacturing the electronics housing is described hereinafter. The metal ring is disposed between the upper cover and the lower cover. The upper cover and the lower cover are integrally fused by virtue of an ultra high frequency technology, and the metal ring is embedded between the upper cover and the lower cover. The nickel-deposited layer of the metal plating layer is electrolessly deposited on the surface of the base body for metalizing the base body. The copper layer of the metal plating layer is plated on the nickel-deposited layer. The nano-nickel layer of the metal plating layer formed by nano-nickel particles is plated on the copper layer. The surface decoration layer of the metal plating layer is plated on the nano-nickel layer. The base body together with the metal plating layer defines at least one assembling hole by a laser cutting technology.

As described above, the upper cover and the lower cover are integrally fused by virtue of the ultra high frequency technology to make the upper cover and the lower cover completely sealed for improving a waterproof performance of the base body, and the metal ring is embedded between the upper cover and the lower cover for improving a current conduction characteristic of the base body. Furthermore, the metal plating layer includes the nano-nickel layer formed by the nano-nickel particles, the nano-nickel particles are capable of making the surface of the electronics housing more compact to have the better abrasion performance and the better corrosion resistance performance, so that the nano-nickel layer of the metal plating layer makes the electronics housing look as an integrally molded appearance. As a result, the electronics housing has a better appearance glossiness.

BRIEF DESCRIPTION OF THE DRAWINGS

The present invention will be apparent to those skilled in the art by reading the following description, with reference to the attached drawings, in which.

DETAILED DESCRIPTION OF THE PREFERRED EMBODIMENT

Figure 1:
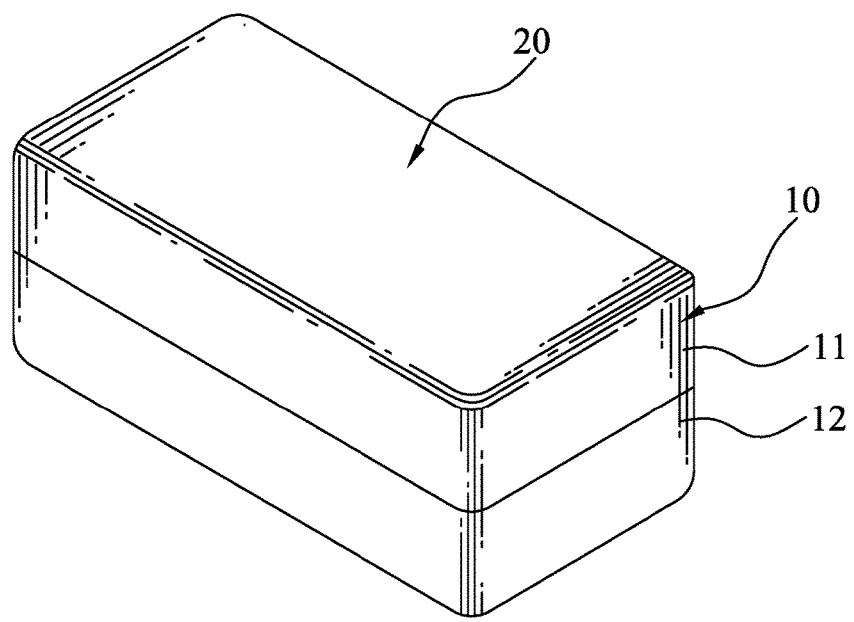
FIG. 1 is a perspective view of an electronics housing in accordance with the present invention.
Figure 5:
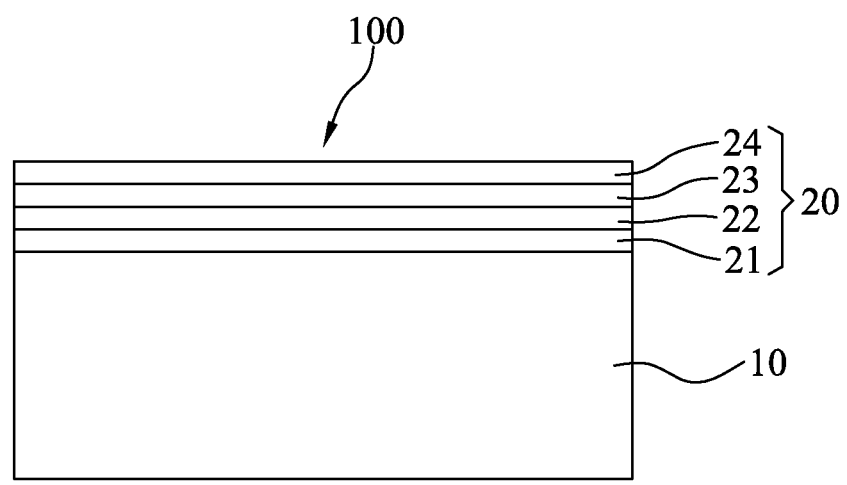
FIG. 5 is a schematic diagram showing that a metal plating layer is formed on a surface of a base body of the electronics housing of FIG. 1.

With reference to FIG. 1 and FIG. 5, an electronics housing 100 in accordance with the present invention is shown. The electronics housing 100 includes a base body 10 and a metal plating layer 20 formed on a surface of the base body 10. The metal plating layer 20 includes a nickel-deposited layer 21 formed on the surface of the base body 10, a copper layer 22 formed on a surface of the nickel-deposited layer 21, a nano-nickel layer 23 formed on a surface of the copper layer 22, and a surface decoration layer 24 formed on a surface of the nano-nickel layer 23.

Figure 2:
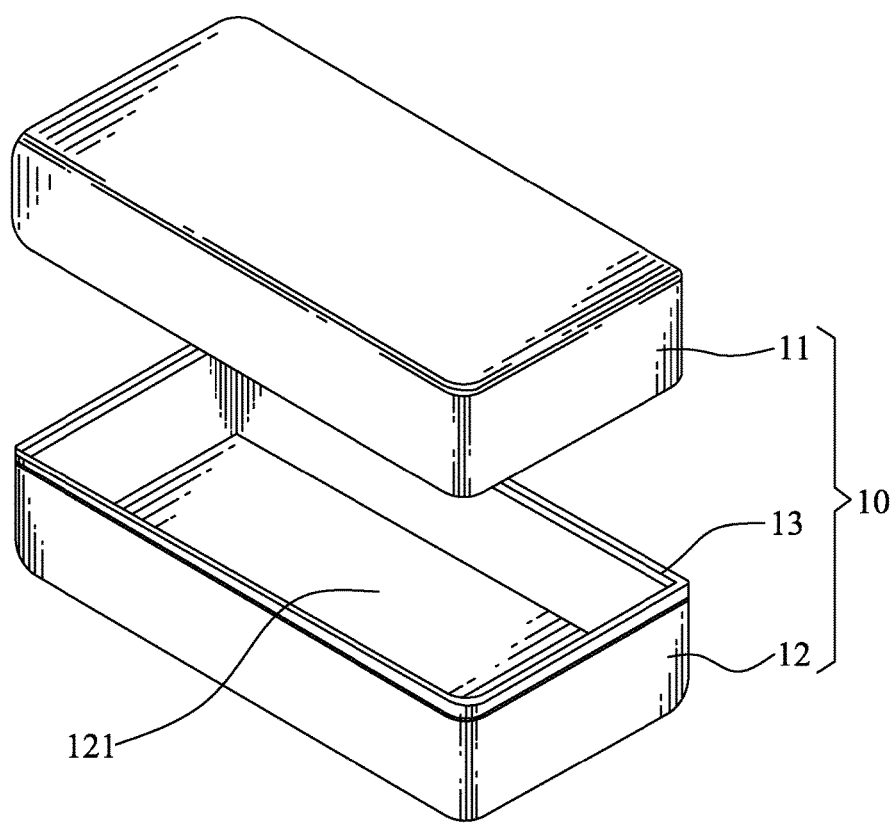
FIG. 2 is a partially exploded view of the electronics housing of FIG. 1.
Figure 3:
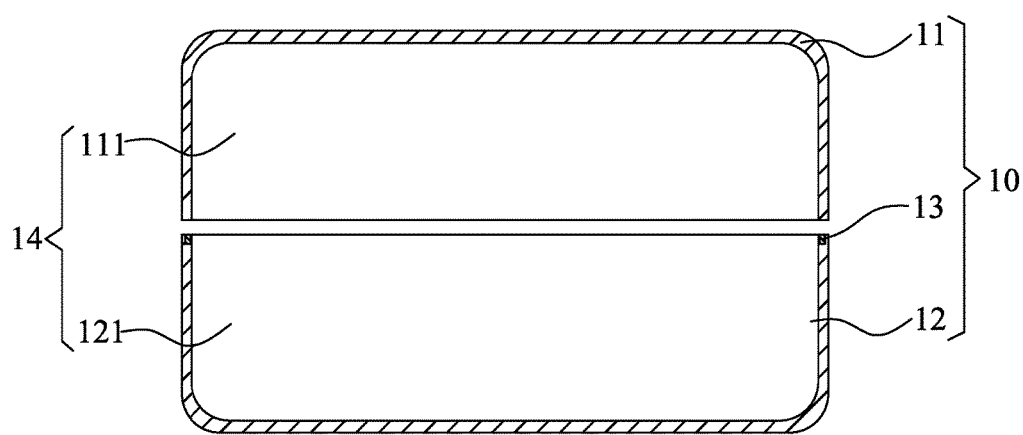
FIG. 3 is a sectional view of the electronics housing of FIG. 1.

Referring to FIG. 1, FIG. 2 and FIG. 3, a material of the base body 10 is acrylonitrile-butadiene-styrene (ABS) plastic which is capable of being plated. The base body 10 includes an upper cover 11, a lower cover 12 and a metal ring 13. The metal ring 13 is a closed copper ring. The upper cover 11 defines a first receiving space 111 penetrating through a middle of a bottom of the upper cover 11. The lower cover 12 defines a second receiving space 121 penetrating through a middle of a top of the lower cover 12. The metal ring 13 is mounted around a top periphery of the lower cover 12. The upper cover 11 is covered on the lower cover 12. The metal ring 13 is mounted between the upper cover 11 and the lower cover 12. The first receiving space 111 is corresponding to the second receiving space 121 to form an accommodating space 14. The upper cover 11 and the lower cover 12 are integrally fused by virtue of an ultra high frequency technology to make the upper cover 11 and the lower cover 12 completely sealed for improving a waterproof performance of the base body 10. And the metal ring 13 is embedded between the upper cover 11 and the lower cover 12 for improving a current conduction characteristic of the base body 10.

Figure 6:
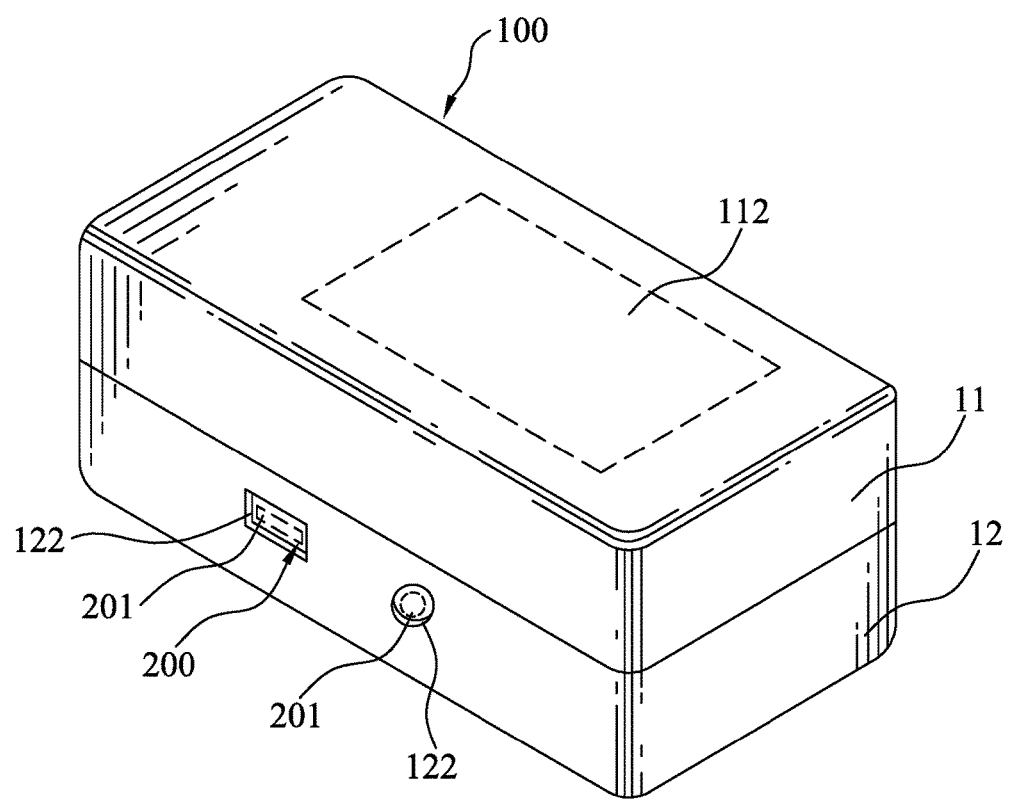
FIG. 6 is a perspective view of the electronics housing in accordance with the present invention being applied to an electronic device.

Referring to FIG. 6, the electronics housing 100 is applied to an electronic device 200. The electronic device 200 has at least a button 201 and a screen (not labeled). The electronic device 200 is a handheld product or a wearable product. The base body 10 together with the metal plating layer 20 defines at least one assembling hole 122 by virtue of a laser cutting technology. Specifically, one side of the lower cover 12 together with one side of the metal plating layer 20 opens two assembling holes 122. The two assembling holes 122 are of different shapes. Preferably, one of the assembling holes 122 is of a circular shape, and the other assembling hole 122 is of a rectangular shape. The circular assembling hole 122 is located in front of the rectangular assembling hole 122. The button 201 is disposed in the assembling hole 122. The upper cover 11 defines an opening 112. The screen is assembled to the opening 112.

Referring to FIG. 1 and FIG. 5, the nickel-deposited layer 21 is formed on the surface of the base body 10 by an electroless deposition way for metalizing the base body 10. Specifically, the base body 10 is immersed in an electroless nickel-deposited solution. The electroless nickel-deposited solution includes a metal salt and a reducing agent. The metal salt is a water soluble hydrochloride, a sulfate or a compound of the water soluble hydrochloride and the sulfate. Preferably, the water soluble hydrochloride is a nickel chloride. The sulfate is a nickel sulfate. The reducing agent is a hypophosphite, a hydroboron or a compound of the hypophosphite and the hydroboron. Preferably, the hypophosphite is sodium hypophosphite, potassium hypophosphite, or a compound of the sodium hypophosphite and the potassium hypophosphite. The hydroboron is sodium borohydride.

Referring to FIG. 1 and FIG. 5, the copper layer 22 is plated on the surface of the nickel-deposited layer 21. Specifically, the base body 10 together with the nickel-deposited layer 21 is immersed in a copper plating solution to be acted as a first cathode. A copper or other insoluble material is acted as a first anode. The copper plating solution is a solution containing copper ions. After a first direct-current power supply is connected, the copper ions are reduced into the copper layer 22 on the surface of the nickel-deposited layer 21.

Figure 4:
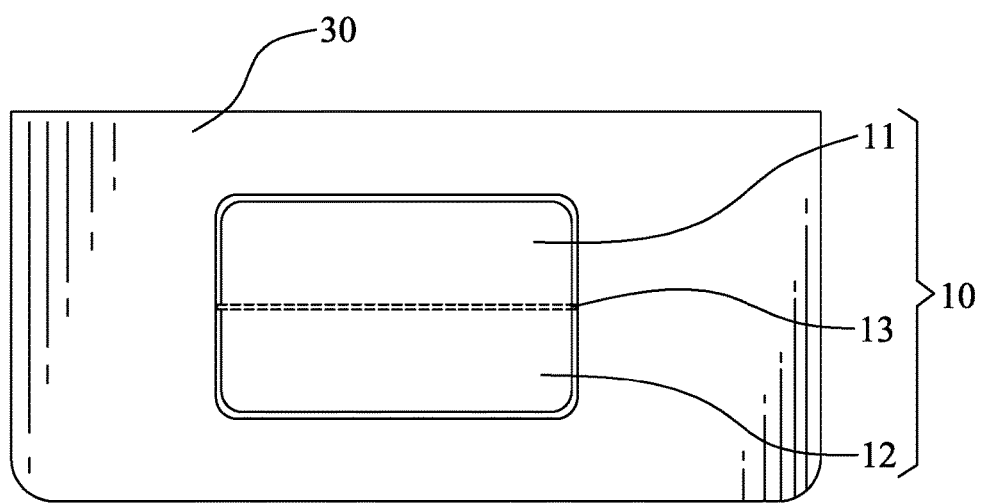
FIG. 4 is a schematic diagram showing that the electronics housing in accordance with the present invention is placed in a plating bath.

Referring to FIG. 1, FIG. 4 and FIG. 5, the nano-nickel layer 23 is plated on the surface of the copper layer 22. The nano-nickel layer 23 is formed by nano-nickel particles, and each of the nano-nickel particles has a nanoscale diameter. The nano-nickel particles are capable of making a surface of the electronics housing 100 more compact to have a better abrasion performance and a better corrosion resistance performance. Specifically, put the base body 10 together with the nickel-deposited layer 21 and the copper layer 22 in a plating bath 30 to be immersed in a nano-nickel plating solution in the plating bath 30. The base body 10 together with the nickel-deposited layer 21 and the copper layer 22 is acted as a second cathode, and a pure nickel target is acted as a second anode. The nano-nickel plating solution is a solution containing nickel ions. A temperature of the nano-nickel plating solution is controlled between 40° C. and 80° C. The pure nickel target are transformed into the nickel ions by electrolysis to be deposited on the surface of the copper layer 22, and the nickel ions are regularly arranged into the layered nano-nickel layer 23 in sequence. The nano-nickel layer 23 of the metal plating layer 20 makes the electronics housing 100 look as an integrally molded appearance.

Referring to FIG. 1 and FIG. 5, the surface decoration layer 24 is plated on the surface of the nano-nickel layer 23. The surface decoration layer 24 is a white chromium layer, a black chromium layer, a gold-plated layer, a palladium-plated layer, a nickel-plated layer or a ternary alloy layer. The ternary alloy is an alloy of copper, tin and zinc.

Referring to FIG. 1 and FIG. 5, when the white chromium layer is plated on the surface of the nano-nickel layer 23, the base body 10 together with the nano-nickel layer 23 is immersed in a white chromium solution to be acted as a third cathode, and an insoluble material is acted as a third anode. The white chromium solution is a solution containing chromium ions. After a second direct-current power supply is connected, the chromium ions of the white chromium solution are reduced to a white chromium layer on the surface of the nano-nickel layer 23.

Referring to FIG. 1 and FIG. 5, when the black chromium layer is plated on the surface of the nano-nickel layer 23, the base body 10 together with the nano-nickel layer 23 is immersed in a black chromium solution to be acted as a fourth cathode, and an insoluble material is acted as a fourth anode. The black chromium solution is a chromic acid—acetic acid solution, a chromic acid—fluoride solution or a chromic acid—nitrate—boric acid solution. After a third direct-current power supply is powered on, chromium ions of the black chromium solution are reduced to the black chromium layer on the surface of the nano-nickel layer 23.

Referring to FIG. 1 and FIG. 5, when the gold-plated layer is plated on the surface of the nano-nickel layer 23, the base body 10 together with the nano-nickel layer 23 is immersed in a gold solution to be acted as a fifth cathode, the insoluble material is acted as a fifth anode. The gold solution is a solution containing monovelent gold ions. After a fourth direct-current power supply is connected, the monovelent gold ions are reduced to the gold-plated layer on the surface of the nano-nickel layer 23.

Referring to FIG. 1 and FIG. 5, when the pallatium layer is plated on the surface of the nano-nickel layer 23, the base body 10 together with the nano-nickel layer 23 is immersed in a pallatium solution to be acted as a sixth cathode, a titanium-coated ruthenium iridium alloy plate is acted as a sixth anode. The pallatium solution is a solution containing pallatium ions. After a fifth direct-current power is connected, the pallatium ions are reduced to the pallatium layer on the surface of the nano-nickel layer 23.

Referring to FIG. 1 and FIG. 5, when the nickel-plated layer is plated on the surface of the nano-nickel layer 23, after the nano-nickel layer 23 is activated by a dilute acid, the base body 10 together with the nano-nickel layer 23 is immersed in a nickel-plated solution to be acted as a seventh cathode, nickel or other insoluble material is acted as a seventh anode. The nickel-plated solution is a solution containing nickel ions. After a sixth direct-current power is powered on, the nickel ions are reduced to the nickel-plated layer on the surface of the nano-nickel layer 23.

Referring to FIG. 1 and FIG. 5, when the ternary alloy layer is plated on the surface of the nano-nickel layer 23, the base body 10 together with the nano-nickel layer 23 is immersed in a ternary alloy solution to be acted as an eighth cathode, an insoluble material is acted as an eighth anode. The ternary alloy solution is a solution containing copper ions, tin ions and zinc ions. After a seventh direct-current power is connected, the copper ions, the tin ions and the zinc ions are reduced to the ternary alloy layer on the surface of the nano-nickel layer 23.

A hardness of a surface of the metal plating layer 20 is 2H level. A thickness of the metal plating layer 20 is 25 μm.

Referring to FIG. 1 to FIG. 6, a manufacturing method of electronics housing adapted for being applied in manufacturing the electronics housing 100, specific steps of the manufacturing method of electronics housing are described as follows.

The metal ring 13 is disposed between the upper cover 11 and the lower cover 12.

The upper cover 11 and the lower cover 12 are integrally fused by virtue of the ultra high frequency technology, and the metal ring 13 is embedded between the upper cover 11 and the lower cover 12.

The nickel-deposited layer 21 of the metal plating layer 20 is electrolessly deposited on the surface of the base body 10 for metalizing the base body 10.

The copper layer 22 of the metal plating layer 20 is plated on the surface of the nickel-deposited layer 21.

The nano-nickel layer 23 of the metal plating layer 20 formed by the nano-nickel particles is plated on the surface of the copper layer 22.

The surface decoration layer 24 of the metal plating layer 20 is plated on the surface of the nano-nickel layer 23.

The base body 10 together with the metal plating layer 20 defines at least one assembling hole 122 by the laser cutting technology.

Preferably, before the base body 10 is metalized, the manufacturing method of electronics housing further includes steps of pre-processing the surface of the base body 10. The pre-processing steps include an oil removal step, a coarsening step, a neutralizing step and activation steps.

The oil removal step is that the surface of the base body 10 is scrubbed by a oil removing liquid for eliminating oil stains and other dirt, the surface of the base body 10 is ensured to be clean and have no oil stains, so that the surface of the base body 10 is beneficial to be uniformly coarsened. A usage life of a coarsening solution used in the following coarsening step is prolonged.

The coarsening step is to coarsen the surface of the base body 10. A purpose of coarsening the surface of the base body 10 is to improve a hydrophilcity of the surface of the base body 10 to make the surface of the base body 10 form a plurality of micropore shapes for ensuring the surface of the base body 10 to form a proper roughing degree, so that the metal plating layer 20 has a better adhesion force. After oil on the base body 10 is removed, the base body 10 is immersed in the coarsening liquid to proceed coarsening. The coarsening liquid is a strong corrosive chromic acid which is formed by a chromic anhydride and a sulfuric acid interacting with each other in proper proportions. A coarsening temperature is 60~70° C.

An effect of the neutralizing step is to eliminate the coarsening liquid of the surface of the base body 10 for prolonging a usage life of an activation liquid used subsequently. The neutralizing step is capable of proceeding by use of various acid liquids. A neutralizing temperature is a room temperature.

The activation steps are to make the coarsened surface of the base body 10 be able to adsorb activator colloids uniformly to provide catalytic carriers for the following electroless nickel-deposited step. The activation steps include a preimpregnation step, a colloid palladium activating step and a peptizing step. The preimpregnation step and the colloid palladium activating step are capable of being combined to be completed.

The preimpregnation step is to immerse the base body 10 in a preimpregnation solution. The preimpregnation solution is capable of eliminating some impurities for buffering an activation liquid and effectively preventing a colloid on the surface of the base body 10 directly contacting neutral water on the surface of the base body 10 from generating a destructive hydrolysis after an acid of the activation liquid is diluted. The preimpregnation solution is a mixed solution of a tin salt and a hydrochloric acid. The tin salt is a stannous chloride, a stannous mono-sulphate, or a compound of the stannous chloride and the stannous mono-sulphate. A preimpregnation temperature is the room temperature.

The colloid palladium activating step is to immerse the preimpregnated base body 10 in the activation liquid. The activation liquid is a mixed solution of a palladium chloride, a hydrochloric acid and the tin salt. A temperature of the activation liquid is 35~45° C.

A core of the colloid attached to the surface of the base body 10 is palladium. An outer periphery of the colloid is particle clusters of divalent tin. In wash, the divalent tin is easily hydrolyzed to a colloidal shape to wrap the palladium, so a catalytic action of the palladium has no way of reflecting. A purpose of the dispergation is to eliminate the divalent tin left on the surface of the base body 10 to expose the palladium and make the palladium become a catalytic activity point of the electroless nickel deposition. A dispergation solution is generally a hydrochloric acid solution. A temperature of the peptization is 35~45° C.

Preferably, a washing step is included for eliminating the solution left on the surface of the base body 10. Water used in the washing step is a deionized water, a distilled water, a purified water or a compound of the deionized water, the distilled water and the purified water.

Preferably, before the upper cover 11 and the lower cover 12 are fused to the integrity, the electronic device 200 defines a window 112.

As described above, the upper cover 11 and the lower cover 12 are integrally fused by virtue of the ultra high frequency technology to make the upper cover 11 and the lower cover 12 completely sealed for improving the waterproof performance of the base body 10, and the metal ring 13 is embedded between the upper cover 11 and the lower cover 12 for improving the current conduction characteristic of the base body 10. Furthermore, the metal plating layer 20 includes the nano-nickel layer 23 formed by the nano-nickel particles, the nano-nickel particles are capable of making the surface of the electronics housing 100 more compact to have the better abrasion performance and the better corrosion resistance performance, so that the nano-nickel layer 23 of the metal plating layer 20 makes the electronics housing 100 look as the integrally molded appearance. As a result, the electronics housing 100 has a better appearance glossiness.

What is claimed is:
1. A manufacturing method of electronics housing adapted for being applied in manufacturing an electronics housing, the electronics housing including a base body and a metal plating layer formed on a surface of the base body, the base body including an upper cover, a lower cover and a metal ring, the manufacturing method of electronics housing comprising the steps of:

the metal ring being disposed between the upper cover and the lower cover;

the upper cover and the lower cover being integrally fused by virtue of an ultra high frequency technology, and the metal ring being embedded between the upper cover and the lower cover;

a nickel-deposited layer of the metal plating layer being electrolessly deposited on the surface of the base body for metalizing the base body;

a copper layer of the metal plating layer being plated on a surface of the nickel-deposited layer;

a nano-nickel layer of the metal plating layer formed by nano-nickel particles being plated on a surface of the copper layer;

a surface decoration layer of the metal plating layer being plated on a surface of the nano-nickel layer; and the base body together with the metal plating layer defining at least one assembling hole by a laser cutting technology.

2. The manufacturing method of electronics housing as claimed in claim 1, wherein each of the nano-nickel particles has a nanoscale diameter.

3. The manufacturing method of electronics housing as claimed in claim 1, wherein the surface decoration layer is plated on the surface of the nano-nickel layer, the surface decoration layer is a white chromium layer, a black chromium layer, a gold-plated layer, a palladium-plated layer, a nickel-plated layer or a ternary alloy layer, the ternary alloy is an alloy of copper, tin and zinc.

4. The manufacturing method of electronics housing as claimed in claim 1, wherein a material of the base body is acrylonitrile-butadiene-styrene plastic which is capable of being plated.

5. The manufacturing method of electronics housing as claimed in claim 1, wherein the metal ring is a closed copper ring.

6. The manufacturing method of electronics housing as claimed in claim 1, wherein a hardness of a surface of the metal plating layer is 2H level.

7. The manufacturing method of electronics housing as claimed in claim 1, wherein a thickness of the metal plating layer is 25 μm.

8. The manufacturing method of electronics housing as claimed in claim 1, wherein the upper cover defines a first receiving space penetrating through a middle of a bottom of the upper cover, the lower cover defines a second receiving space penetrating through a middle of a top of the lower cover, the upper cover is covered on the lower cover, the first receiving space is corresponding to the second receiving space to form an accommodating space.

9. The manufacturing method of electronics housing as claimed in claim 1, wherein the electronics housing is applied to an electronic device, the electronic device has at least a button, the base body together with the metal plating layer defines at least one assembling hole, the button is disposed in the assembling hole.

* * * * *